United States Patent [19]

Watanabe et al.

[11] 4,242,373
[45] Dec. 30, 1980

[54] METHOD FOR VAPOR DEPOSITING A CERIUM OXIDE FILM

[75] Inventors: Kiyoshi Watanabe; Kazuo Sunahara; Tsutomu Fujita, all of Mobara, Japan

[73] Assignee: Hitachi, Ltd., Japan

[21] Appl. No.: 910,344

[22] Filed: May 30, 1978

Related U.S. Application Data

[63] Continuation-in-part of Ser. No. 768,755, Feb. 15, 1977, abandoned.

[30] Foreign Application Priority Data

| Feb. 20, 1976 [JP] | Japan | 51/17080 |
| Feb. 20, 1976 [JP] | Japan | 51/17081 |
| Feb. 17, 1977 [DE] | Fed. Rep. of Germany | 2706896 |
| Feb. 18, 1977 [FR] | France | 77 04857 |
| Feb. 18, 1977 [NL] | Netherlands | 7701757 |
| Feb. 18, 1977 [GB] | United Kingdom | 6971/77 |

[51] Int. Cl.³ .......................... B05D 1/00; H01J 31/26
[52] U.S. Cl. ........................ 427/74; 427/75; 427/248.1
[58] Field of Search ............... 427/74, 75, 255, 50, 427/69, 70, 78, 81, 91, 99, 107, 109, 124, 166, 237, 248 R, 248 G, 248 J; 357/31; 313/385, 386

[56] References Cited

U.S. PATENT DOCUMENTS

| 3,020,432 | 2/1962 | Nicholson | 427/255 X |
| 3,350,595 | 10/1967 | Kramer | 313/386 X |
| 3,632,442 | 1/1972 | Turnbull | 427/74 |
| 3,644,101 | 2/1972 | Takashio et al. | 427/74 X |
| 3,985,918 | 10/1976 | Fukai et al. | 427/255 X |
| 3,988,758 | 10/1976 | Fuji | 357/31 |

*Primary Examiner*—James R. Hoffman
*Attorney, Agent, or Firm*—Craig & Antonelli

[57] ABSTRACT

A method for forming a thin film of cerium oxide as a blocking layer which constitutes a portion of a photoelectric film of a blocking type image pickup tube is disclosed. A substrate deposition rate in a vacuum deposition process is established in a range between 0.01 to 0.6 Å/sec to prevent the deposition of particles which result in black or white spots in a picture image. It is more effective to select a particle size of 5 μ or more for the primary particles to be deposited.

5 Claims, 5 Drawing Figures

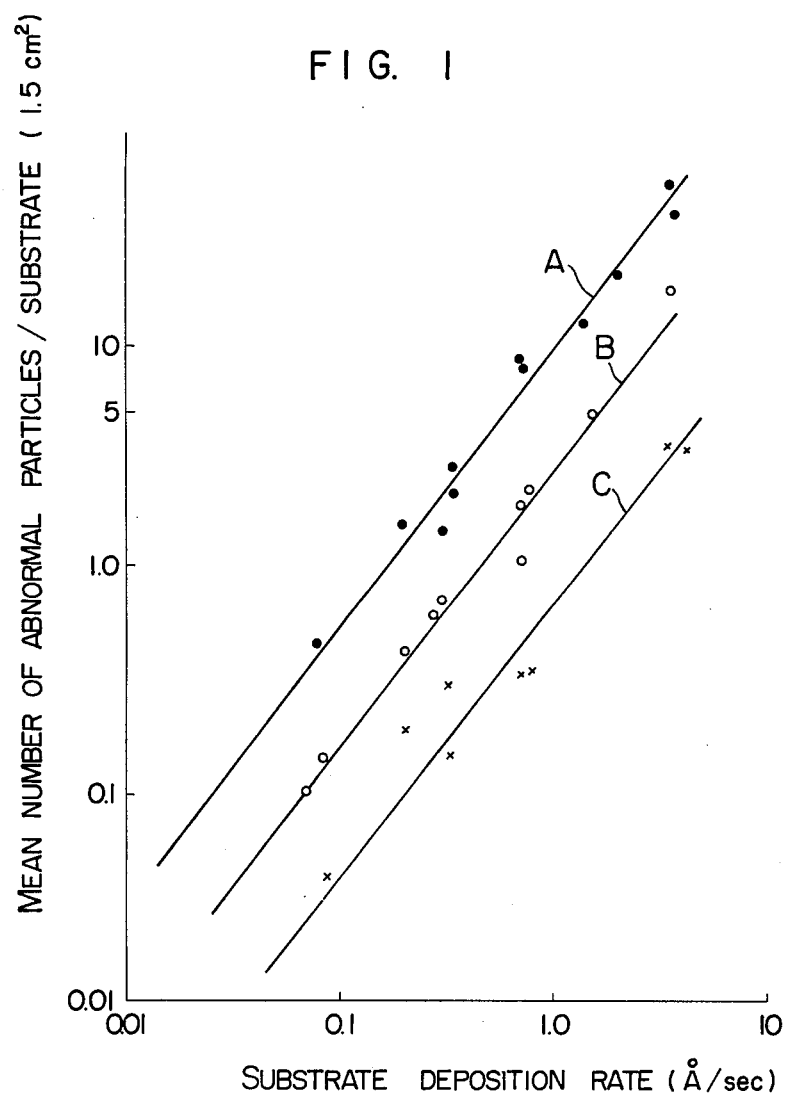

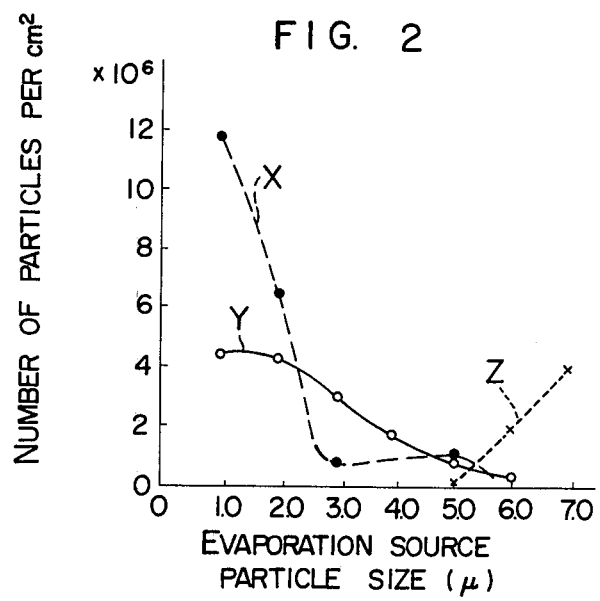
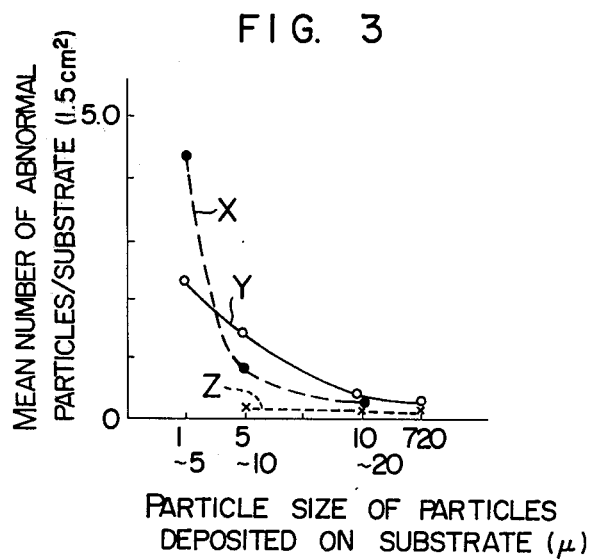

METHOD FOR VAPOR DEPOSITING A CERIUM OXIDE FILM

CROSS-REFERENCE TO RELATED APPLICATION

This is a continuation-in-part of application Ser. No. 768,755, filed on Feb. 15, 1977, now abandoned.

The present invention relates to a method for vapor depositing a thin film of cerium oxide, and more particularly to a method for vapor depositing a thin film of cerium oxide as a blocking layer which constitutes a portion of a photoelectric film of a blocking type image pickup tube.

Recently, an image pickup tube including a photoconductive target which utilizes a non-crystalline photoconductive film wherein use is made of a hetero-junction between a P-type photoconductive film containing selenium, arsenic and tellurium, and an N-type conductive film has been proposed.

The image pickup tube of this type is characterized in that it has a wide range of spectrum sensitivity, fast response time, low dark current and a high resolution, and that it is easy to manufacture.

Typically, the target structure of the image pickup tube having these characteristics is constructed such that a transparent conductive film consisting essentially of indium oxide or stannic oxide having N-type conductivity is coated on the rear surface of a glass substrate or a glass window that transmits the incident light rays to the image pickup tube, such that another N-type transparent conductive film of cerium oxide as the blocking layer is formed on the rear side of the N-type transparent conductive film, and such that a P-type photoconductive film comprising selenium less than 30 atomic % of arsenic, for example, a P-type photoconductive film comprising a mixture of a first photoconductive substance consisting of selenium and less than 40 atomic % of tellurium and a second photoconductive substance consisting of selenium and 10 atomic % of arsenic is deposited on the rear surface of the N-type transparent conductive film of cerium oxide through a hetero-junction surface. Instead of cerium oxide, cadmium selenide, cadmium sulfide, zinc sulfide, gallium arsenide, germanium and silicon may be used. Furthermore, for the purpose of improving the landing characteristic of an electron beam emitted from an electron beam emitting device of the photoconductive film, a porous film of antimony trisulfide ($Sb_2S_3$) is formed on the rear surface of the P-type photoconductive film. The image pickup tube having the above mentioned structure of the blocking type is called a Saticon tube which is the trade name of Nippon Hoso Kyokai.

The present invention relates, more particularly, to a method of vapor depositing a thin film of cerium oxide of 1000 Å or less thickness on the n-type conductive transparent film of the Saticon tube wherein the thin film of cerium oxide serves to prevent the injection of holes from the n-type conductive film under a reverse-biased condition between the hetero-junction.

Usually, the vapor deposition of cerium oxide has been carried out by placing powdered or sintered cerium oxide in a vessel, called a boat, of an appropriate shape and heating the boat to evaporate the cerium oxide, or by heating the sintered cerium oxide by an electron beam, to evaporate the cerium oxide to cause the cerium oxide to disperse. The vapor deposition rate in such a process has been set to 50 Å/sec or more as in a conventional vapor deposition from a standpoint of industrial economy.

A light receiving area of a Saticon tube having the cerium oxide thin film formed thereon is 12.7 mm×9.5 mm for a 1″ tube and 8.8 mm×6.5 mm for a ⅔″ tube. Since an enlarged image appears on a video monitor, if defect spots exist in the photoconductive film which generates an electric signal, black or white spots appear on the picture image, which materially deteriorate the quality of the image.

Although dust introduced from an atmosphere is one of the causes for the defect spots, what is more important is the fact that another cause is brought about by the deposition of lumps of the cerium oxide per se. Since the thickness of a Saticon film is in the order of 4 microns, the lump of a diameter of 3 microns or more directly leads to a defect spot on the image.

The reason for the deposition of the lumps of the cerium oxide is considered as follows; since the cerium oxide is vapor deposited through sublimation, it is not melted during the evaporation but primary particles of the cerium oxide used as the evaporation source are directly sublimated or molecules of the cerium oxide are sublimated from the surfaces of the particles. As a result, the particle diameter reduces as compared with the initial diameter. The particles of such reduced diameter are moved up toward a substrate by a vapor pressure of the evaporated molecules and may sometimes collide by being heated by gas confined in the boat to cause the particles to jump up and to deposit on the substrate.

The phenomenon of the occurrence of the spot deposition on the deposited substrate is due to a basic nature of the cerium oxide, i.e. the cerium oxide is a sublimation type material. Consequently, cerium oxide sublimates by a heat radiation from the boat during the vacuum deposition rather than the primary particles of the cerium oxide as the evaporation source sintering together or fusing together to form larger sizes of secondary particles as in non-sublimation type material, and hence the bonds between the primary particles are readily broken. Thus, this is a drawback which is inherent to the prior art vapor deposition method, and so long as such method is used the probability of obtaining the Saticon tube of a high quality is very low.

It is an object of the present invention to eliminate the drawback which is inherent to the prior art method and to provide a method of vapor depositing a thin film of cerium oxide which is free from defect spots.

In order to achieve the above object, the present method controls the vapor deposition rate and preferably adjusts the grain size of the cerium oxide particles.

The above and other objects, features and advantages of the present invention will be apparent from the following detailed description of the preferred embodiments of the invention when taken in conjunction with the accompanying drawings, in which:

FIG. 1 is a chart showing a relation between a substrate deposition rate and a mean number of abnormal particles.

FIG. 2 is a chart showing a relation between a particle diameter of evaporation source particles and the number of particles.

FIG. 3 is a chart showing a relation between the diameters of particles deposited on the substrate and the number of particles.

Figure 4:
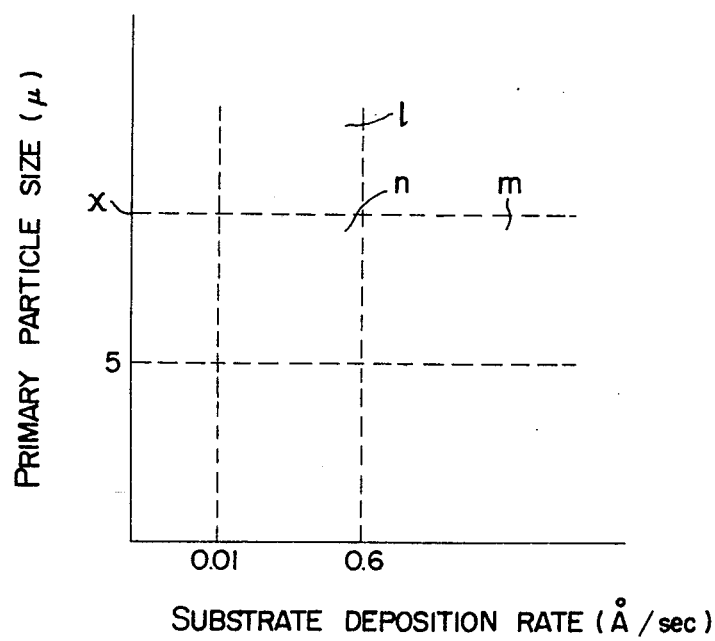
FIG. 4 is a chart showing a relation between the substrate deposition rate and the mean number of the particles.

In general, the molecules evaporated from a boat fly from an opening of the boat toward a substrate on which they are to be deposited with an energy determined by the temperature of the boat and the molecular weight. The amount of the molecules evaporated is determined by a vapor pressure of the evaporated material. Where a constant flow of the evaporated molecules from the boat to the substrate exists, if there exists a fine particle in the evaporation source, it collide with the evaporated molecules to obtain an energy which is sufficient to move the particle to the substrate.

In this case, the maximum size of the particles deposited on the substrate is to be determined by the mass of the particles, the collision cross with the evaporated molecules and the distance from the boat to the substrate. And the size distribution and the number of the particles deposited on the substrate for the sublimation system are to be determined by the size distribution and the number of the primary particles of the evaporation source loaded in the source, the distance from the boat to the substrate and the energy and the quantity of the evaporated molecules.

However, the distance from the boat to the substrate is restricted by the size of the vacuum deposition apparatus and hence it cannot be used as an effective control means for controlling the size distribution and the number of the particles to be deposited on the substrate. Accordingly, in the method of the present invention, the energy of the evaporated molecule and the quantity of the evaporation thereof are controlled by the temperature of the boat and the substrate deposition rate is regulated as a parameter.

In a vacuum device of $10^{-6}$ Torr–$5\times10^{-5}$ Torr, there was arranged molybdenum boat of a V-shaped cross section having a thickness of 0.25 mm, a width of 6 mm and a length of 100 mm. About 250 mg of commercially available cerium oxide particles having particle size distribution corresponding to an X-lot shown in FIG. 2 were loaded in the boat, and a ⅜" diameter substrate on which deposition was to be made was disposed 30 cm above the boat. The boat was gradually heated to vapor deposit the cerium oxide. A shutter disposed 5 cm above the boat was kept closed until the temperature of the boat reached 1300° C. as measured by an optical pyrometer in order to prevent the deposition to the substrate due to bumping of the cerium oxide particles by absorption gas. When the temperature of the cerium oxide reached a predetermined temperature above 1300° C., the shutter was opened to start the vapor deposition on the substrate. the substrate deposition rate of the cerium oxide was determined while measuring the amount of deposition on a monitor.

FIG. 1 shows a relation between the substrate deposition rate (Å/sec) of the vapor deposited cerium oxide and the mean number of abnormal particles deposited on the substrate of a 1.5 cm² area when the cerium oxide was deposited to a film thickness of 1000 Å. In FIG. 1, a line A was taken for the deposited abnormal cerium oxide particles having particle size of 1–5μ, a line B was taken for the deposited abnormal cerium oxide particles having particle size of 5–10μ, and a line C was taken for the deposited abnormal cerium oxide particles having particle size of more than 10μ. The number of abnormal particles deposited on the substrate was measured by a microscope of a magnification factor of 100 with oblique projection.

For a comparison purpose, it is stated that in a conventional vapor deposition process using the deposition rate of, for example, 50 Å/sec, 2000 or more abnormal particles were deposited on the substrate.

It is apparent from FIG. 1 that the number of abnormal particles deposited on the substrate decreases as the substrate deposition rate decreases, and there exists a linear relation therebetween when represented in logarithmic scale. Accordingly, by selecting a practical substrate deposition rate depending on a particular substrate area, a thin film of cerium oxide of a desired quality can be obtained.

It has been found that when the mean number of abnormal particles deposited on the substrate is not larger than 5.0 particles per substrate, a yield for a practically acceptable, good substrate is determined depending on the substrate deposition rate. Table 1 below shows a relation between the mean number of abnormal particles deposited on the substrate and the yield.

TABLE 1

| Mean Number of Abnormal Particles Deposited on Substrate | Yield for Good Product |
| --- | --- |
| 50 per substrate | ≦10% |
| 10 per substrate | 0–20% |
| 5 per substrate | 20–70% |
| 1 per substrate | 50–100% |
| 0.5 per substrate | 50–100% |
| 0.1 per substrate | 70–100% |

It is seen from FIG. 1 and Table 1 that a practical range for the substrate deposition rate is between 0.6 Å/sec and 0.01 Å/sec. From a standpoint of the production efficiency and the industrial economy due to the yield, the substrate deposition rate from 0.03 Å/sec to 0.5 Å/sec is most effective.

Figure 5:
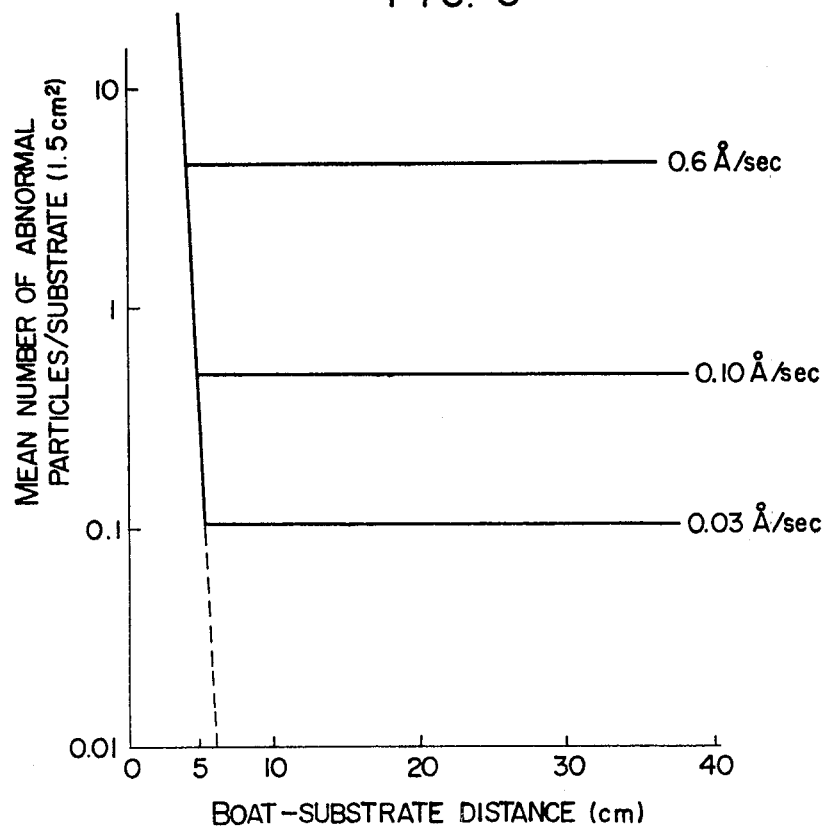
FIG. 5 is a chart showing a relation between the mean number of abnormal particles and the boat-substrate distance.

In the above experiment, a boat-substrate distance is limited to 30 cm. However, as shown in FIG. 5, the distance is not limited thereto and can be selected from a range above 5 cm in which and in the above mentioned effective substrate deposition rate the mean numbers of abnormal particles/substrate is maintained less than five.

In another experiment, under the same vapor deposition conditions as those in the previous experiment, the substrate deposition rate was set to 0.4 Å/sec and thin films of 1000 Å thickness were formed using three kinds of cerium oxide particle sources having different particle size distributions. FIG. 2 numbers of $CeO_2$ source or primary particles per unit area observed for every micron diameter of particles. The observation was made in order to count the numbers of particles in each group having the same micron diameter by a scanning electron microscope (SEM), for the three kinds of lots X, Y and Z.

In FIG. 2, curves X and Y were taken for commercially available cerium oxide lots and a curve Z was taken for a cerium oxide lot which was specially prepared to eliminate the primary particles of less than 5μ by sintering and classification. It is seen from FIG. 2 that a considerable number of primary particles of less than 3μ are included in commercially available cerium oxide lots X and Y while only a small number of such primary particles are included in the specially prepared lot Z. FIG. 3 shows mean number of abnormal particles deposited on 20 substrates obtained from the above lots. In FIG. 3, the same legends as those in FIG. 2 are used. As seen from FIG. 3, the distribution of the mean number of abnormal particles deposited on the substrate has a tendency to match the size distribution of the primary particles shown in FIG. 2. This proves the aforementioned mechanism of the dispersement of particles during the evaporation in the sublimation system. As a result, it has been proved that it is a very effective way to select the particle size of the primary particles of the cerium oxide loaded in the boat to be $5\mu$ or more, although the thin film of cerium oxide of a desired quality is obtained at the substrate deposition rate between 0.01 Å/sec and 0.6 Å/sec even when the commercially available X or Y lot shown in FIG. 2 is used as an evaporation source. Incidentally, a boat which is sometimes called a laminated boat has been known as an approach to prevent the deposition of the abnormal particles which result in defect spots on the image. Such a laminated boat comprises generally closed top and bottom plates between which an intermediate plate having a pair of two holes is held, the top plate having a hole formed therein at a position misaligned with the two holes in the intermediate plate. Cerium oxide particles are loaded between the bottom plate and the intermediate plate for heating. The inventors of the present invention have made an experiment for the three lots X, Y and Z described above using the laminated boat, and found that the mean number of abnormal particles deposited on the substrate remained unchanged from that shown in FIG. 3 and hence the laminated boat was not effective to attain the desired result. Therefore, it has been provided that it is very effective in obtaining the cerium oxide film of a high quality to set the particle size of the cerium oxide loaded in the boat to a proper range as described above.

FIG. 4 shows a relation between the first and second experiments. In FIG. 4, the abscissa represents a substrate deposition rate while an ordinate represents a particle size of the primary particles. It is seen from FIG. 4 that a satisfactory vapor deposition is attainable by establishing the vapor deposition condition in either zone l or zone m. It should be understood that most satisfactory vapor deposition is attained at a point n at which the zones l and m cross, that is, when the both conditions of the particle size of the primary particles being $5\mu$ or more and the substrate deposition rate being from 0.01 Å/sec to 0.6 Å/sec are met. The upper limit x of the particle size in FIG. 4 may be decided appropriately considering various factors such as the substrate deposition rate.

We claim:

1. A method for vapor depositing a thin film of cerium oxide on a substrate comprising the steps of:
    loading commercially available particulate or sintered cerium oxide including particles of $3\mu$ or less in a vapor deposition boat; and
    heating said cerium oxide under a predetermined vacuum to cause the cerium oxide to disperse for forming said thin film on said substrate with the deposition rate of the cerium oxide being set between 0.01 Å/sec and 0.6 Å/sec.

2. A method for vapor depositing a thin film of cerium oxide on a substrate comprising the steps of:
    loading particulate or sintered cerium oxide prepared to include only particles of $5\mu$ or more in a vapor deposition boat; and
    heating said cerium oxide under a predetermined vacuum to cause the cerium oxide to disperse for forming said thin film on said substrate with the deposition rate of the cerium oxide being set between 0.01 Å/sec and 0.6 Å/sec.

3. A method for vapor depositing a thin film of cerium oxide according to claim 1 wherein said substrate is disposed approximately 5 cm or more directly above said vapor deposition boat.

4. A method for vapor depositing a thin film of cerium oxide according to claim 1 wherein said predetermined vacuum is such that the cerium oxide is heated at pressure between $10^{-6}$ Torr and $10^{-5}$ Torr.

5. A method for vapor depositing a thin film of cerium oxide according to claim 1 wherein the particle size of the particulate or sintered cerium oxide is adjusted so that the mean number of particles of $1\mu$ or more deposited on the substrate is not larger than 5.0 particles per 1.5 cm$^2$ of substrate whereby an acceptable yield of product is obtained.

* * * * *